United States Patent
Blaschke et al.

(10) Patent No.: US 9,105,681 B2
(45) Date of Patent: Aug. 11, 2015

(54) METHOD FOR FORMING DEEP SILICON VIA FOR GROUNDING OF CIRCUITS AND DEVICES, EMITTER BALLASTING AND ISOLATION

(71) Applicant: Newport Fab, LLC, Newport Beach, CA (US)

(72) Inventors: Volker Blaschke, Irvine, CA (US); Todd Thibeault, Costa Mesa, CA (US); Chris Cureton, Laguna Beach, CA (US); Paul Hurwitz, Irvine, CA (US); Arjun Kar-Roy, Irvine, CA (US); David Howard, Irvine, CA (US); Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 127 days.

(21) Appl. No.: 13/657,007

(22) Filed: Oct. 22, 2012

(65) Prior Publication Data

US 2013/0109176 A1    May 2, 2013

Related U.S. Application Data

(62) Division of application No. 12/800,663, filed on May 20, 2010, now Pat. No. 8,598,713.

(60) Provisional application No. 61/271,502, filed on Jul. 22, 2009.

(51) Int. Cl.
*H01L 21/768* (2006.01)
*H01L 21/74* (2006.01)

(52) U.S. Cl.
CPC ....... *H01L 21/743* (2013.01); *H01L 2924/0002* (2013.01)

(58) Field of Classification Search
CPC .................................................... H01L 21/743
See application file for complete search history.

(56) References Cited

U.S. PATENT DOCUMENTS

2004/0241970 A1* 12/2004 Ring .............................. 438/571
2006/0226412 A1  10/2006 Saxler

* cited by examiner

*Primary Examiner* — Seahvosh Nikmanesh
(74) *Attorney, Agent, or Firm* — Farjami & Farjami LLP

(57) ABSTRACT

According to an exemplary embodiment, a semiconductor die including at least one deep silicon via is provided. The deep silicon via comprises a deep silicon via opening that extends through at least one pre-metal dielectric layer of the semiconductor die, at least one epitaxial layer of the semiconductor die, and partially into a conductive substrate of the semiconductor die. The deep silicon via further comprises a conductive plug situated in the deep silicon via opening and forming an electrical contact with the conductive substrate. The deep silicon via may include a sidewall dielectric layer and a bottom conductive layer. A method for making a deep silicon via is also disclosed. The deep silicon via is used to, for example, provide a ground connection for power transistors in the semiconductor die.

16 Claims, 5 Drawing Sheets

METHOD FOR FORMING DEEP SILICON VIA FOR GROUNDING OF CIRCUITS AND DEVICES, EMITTER BALLASTING AND ISOLATION

This is a divisional of application Ser. No. 12/800,663 filed May 20, 2010 now U.S. Pat. No. 8,598,713.

The present application claims the benefit of and priority to provisional patent application entitled "Non-Through Wafer Via Ground Contact for Power Transistors," Ser. No. 61/271,502 filed on Jul. 22, 2009. The disclosure in that provisional application is hereby incorporated fully by reference into the present application.

BACKGROUND OF THE INVENTION

1. Field of the Invention

The present invention is in generally in the field of semiconductors. More particularly, the invention is in the field of fabrication of transistor circuits.

2. Background Art

High operating frequencies and currents seriously limit the performance of power devices and transistors. One problem lies when bond wires are used to connect a single-ended power transistor to a ground node. At high operating frequencies and currents, the inductance of a bond wire creates a noticeable voltage drop between the power transistor, for example an emitter terminal of the power transistor, and the ground node. The voltage drop can pull the power transistor out of its operating region, also called de-biasing the transistor. In addition, the voltage drop between the emitter terminal and ground node reduces the voltage swing over the transistor requiring a much higher supply voltage, leading to lower efficiency and shorter battery life for wireless applications. Another problem resides in distributing large currents through one or more power transistors. Due to the thermal properties of each power transistor, the current can be thermally hogged by one transistor or can increase in the center of large arrays of transistors with respect to the outer areas of the array, heating up the internal junctions within that device. This phenomenon, known as thermal runaway, can destroy a power semiconductor transistor or device or significantly hurt the performance of a power transistor circuit.

A further problem is posed by the very low input and output impedances of an amplifier using Si or SiGe BJT's. These amplifiers have a very high current gain leading to difficult matching conditions and particularly a non-linear gain observed in gain expansion over input power. By applying a small resistance at the output or emitter of the transistor, the gain can be reduced, leading to a device that can be easier matched for optimum power amplification and efficiency. This small resistance also improves the linearity of the gain of the device, leading to higher efficiency and more power output per transistor.

Another problem for amplifier circuits and particularly wireless power amplifiers is the mismatch at the output which leads to power being reflected back into the transistor that could destroy the transistor. A resistance at the output of the transistor will reduce the amount of the power or voltage over the transistor output preventing it from being damaged.

In one approach, a through-wafer via has been used to directly connect a power transistor to a conductive ground plane on the backside of a substrate. Although through-wafer vias have an inductance that is significantly less than the inductance of bond wires, one problem with through-wafer vias is that they still have a relatively high inductance and are very large and deep, resulting in some of the problems discussed above. Moreover, although through-wafer vias may have very small resistances and function relatively well at high operating currents, these structures are too large and can not be used to provide a resistance at the ground node of the transistor to function for example as ballast resistors or as resistors to improve matching, linearize the gain or protect the transistor from power reflection. Moreover, ballast resistors that are conventionally used to prevent thermal runaway disadvantageously take up a lot of semiconductor area. In addition, through wafer via requires extensive processing from the wafer backside after the wafer is fully processed on the frontside, which is very costly and leads to manufacturing problems for larger wafer diameters such as 200 mm and beyond.

Thus, there is a need in the art for an effective conductive structure that provides a reduced inductance at some small parasitic resistance, that is capable of direct connection to a substrate or ground path, provides some control over distribution of resistance at the transistor output, and that consumes a small semiconductor area, and reduces the extent of wafer backside processing.

SUMMARY OF THE INVENTION

A deep silicon via for grounding of circuits and devices, emitter ballasting and isolation, substantially as shown in and/or described in connection with at least one of the figures, as set forth more fully in the claims.

DETAILED DESCRIPTION OF THE INVENTION

Figure 1:
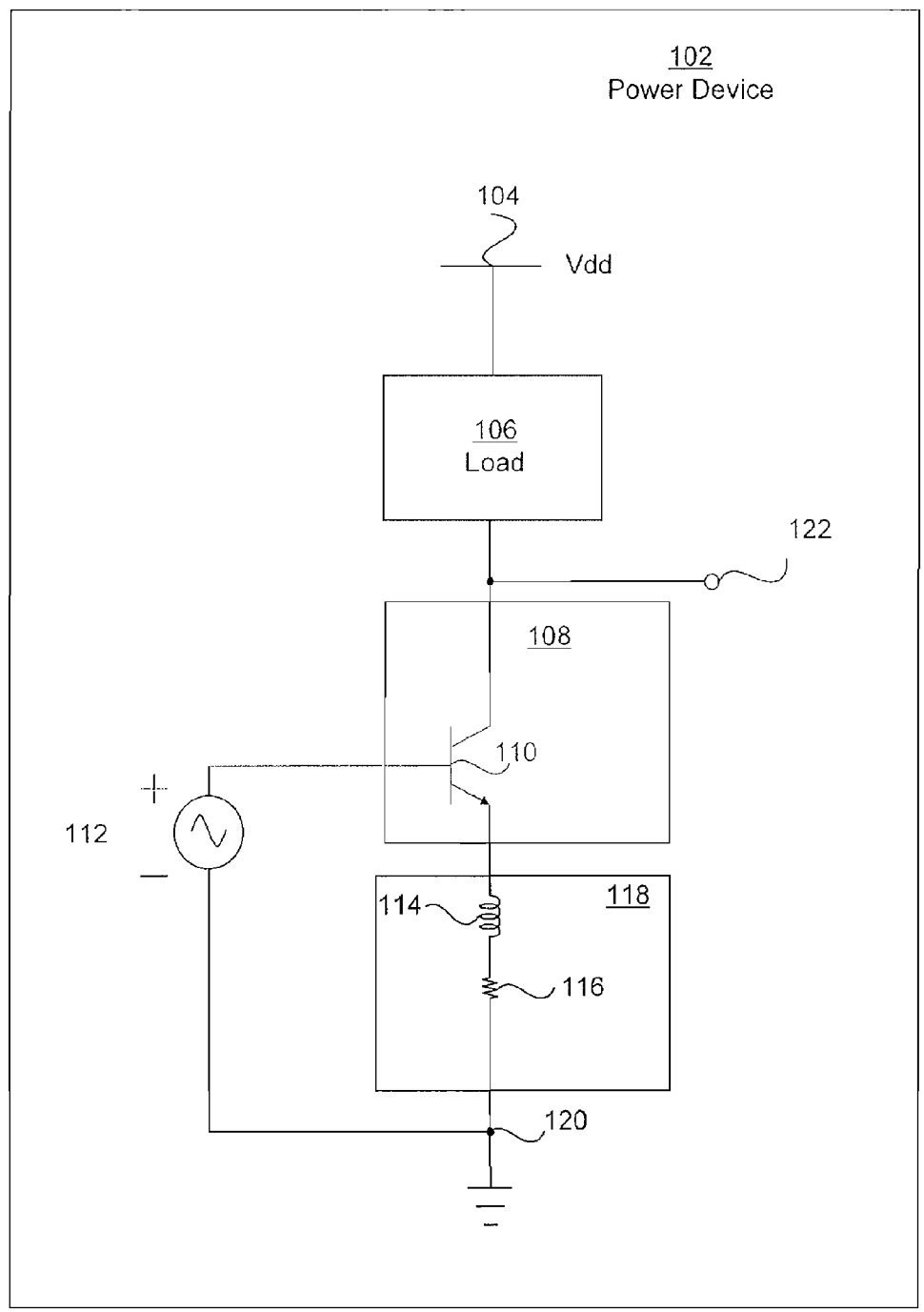
FIG. 1 illustrates a circuit-level diagram of an exemplary power device for the purpose of illustrating certain concepts in the present invention.

The present invention is directed to a deep silicon via for grounding of circuits and devices, emitter ballasting and isolation. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings. It should be borne in mind that, unless noted otherwise, like or corresponding elements among the figures may be indicated by like or corresponding reference numerals. Moreover, the drawings and illustrations in the present application are generally not to scale, and are not intended to correspond to actual or relative dimensions.

FIG. 1 illustrates a circuit-level diagram of an exemplary power device 102 used solely for the purpose of discussing certain concepts in the present application. Power device 102 comprises Vdd 104 to supply a positive reference voltage, and ground node 120 corresponding to a reference voltage of zero volts. It is noted that in the present application, the terms "ground," "ground node," and/or "ground plane" and the like refer to a common reference potential or a common potential, which do not have to be equal to zero volts and can be a constant DC voltage other than zero volts. Thus, the terms "ground," "ground node," and/or "ground plane" and the like can be used interchangeably and are synonymous with "common reference potential," "common potential," and/or "common potential plane," and the like in the present application. Power device 102 further includes power amplifier 108, which in the present example is shown as power bipolar junction transistor (BJT) 110. As shown, load 106 keeps the collector of BJT 110 at a proper direct current (DC) voltage so that BJT 110 operates in a valid operating region. As shown, power amplifier 108 provides single-ended amplification of input voltage 112 to produce output voltage 122. Additionally, in the present example, power amplifier 108 is connected in a common-emitter configuration, meaning the emitter of BJT 110 is connected directly or indirectly to a common ground node referenced by both input voltage 112 and output voltage 122. Inductor 114 and resistor 116 correspond to the parasitic inductance and parasitic resistance of electrical interconnect lines connecting the emitter of BJT 110 to ground node 120.

One shortcoming with respect to power device 102 is that a high impedance ground path may appear at high frequencies and large operating currents when the emitter of BJT 110 is intended to be directly connected to ground node 120. For example, both a conventional bond wire and the more recent through-wafer via connection techniques represent an undesirably large inductance, which at high frequencies, for example in RF applications, and at high currents, for example in power amplifiers, causes a large voltage drop between the emitter of BJT 110 and ground node 120.

Another shortcoming is that a conventional bond wire, is difficult to control in length during the packaging process, leading to large variation of bondwire parasitic and thus variation in the voltage drop between the emitter of BJT 110 and ground node 120.

Still another shortcoming is the problem of the thermal runaway current when one or more power devices, such as power device 102, are connected in parallel. When transistors such as BJT 110 are connected in parallel to handle a high current, the thermal and other physical properties of each transistor may create a positive feedback loop between current and junction temperature. Each transistor may hog more than its share of current, damaging the transistor. To prevent this phenomenon, known as thermal runaway, a ballast resistor is connected to the emitter of each transistor to moderate the current flowing in the transistor, by providing a negative feedback into the input voltage of the transistor. Resistor 116, which can be purposely inserted as a ballast resistor (as opposed to being an undesirable parasitic resistor) is required to be well controlled, since such ballast resistor is needed in some circumstances to thermally stabilize BJT 110. If ballast resistor 116 were a discrete resistor, it would require additional layout space on the same die as BJT 110. If resistor 116 were a through-wafer via, it would be too bulky and with too small of a resistance to serve as a ballast resistance.

Figure 2:
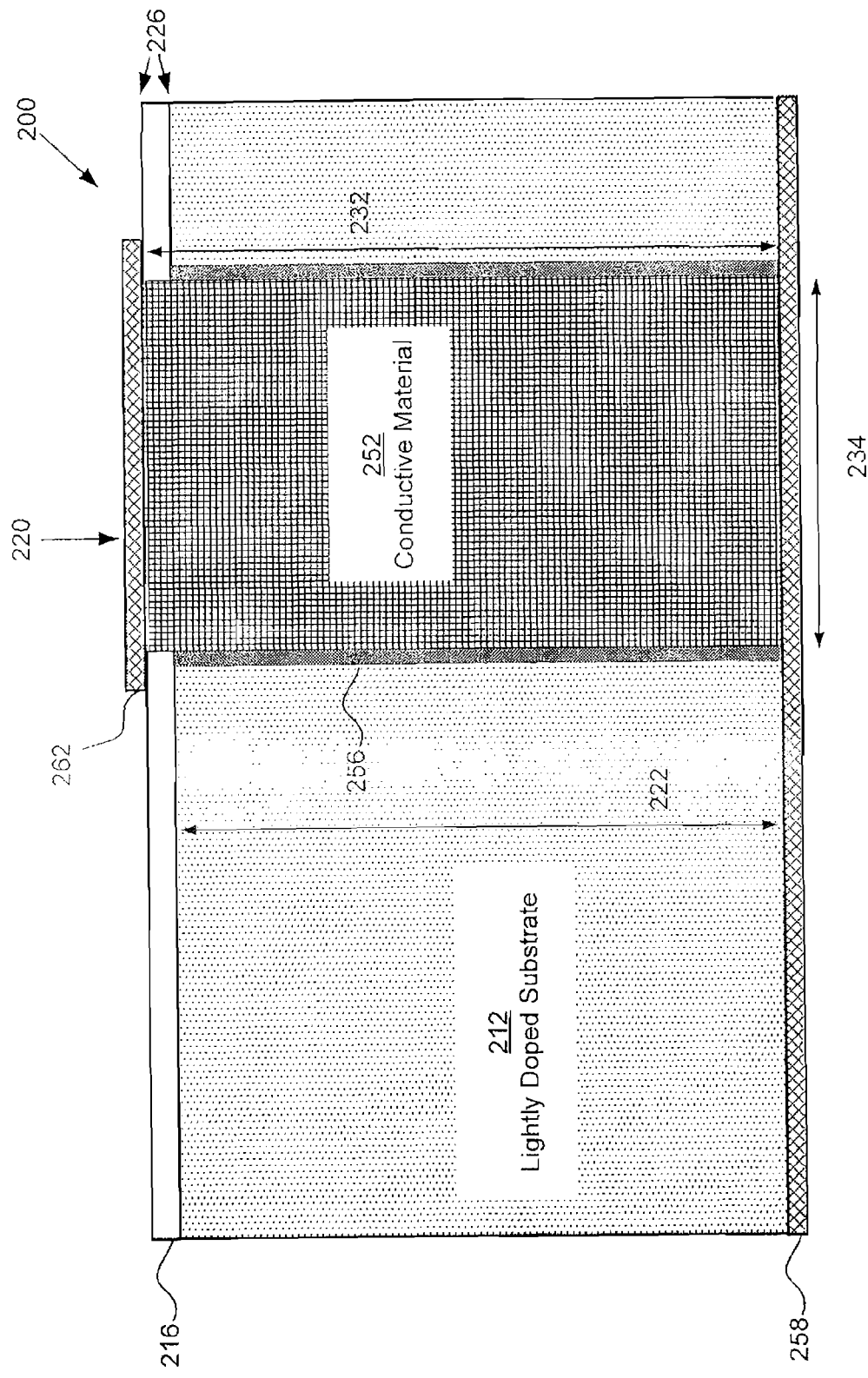
FIG. 2 illustrates a conventional through-wafer via in an exemplary semiconductor die.

FIG. 2 shows conventional through-wafer via (TWV) 220 in exemplary semiconductor die 200. TWV 220 can be used to connect the emitter of BJT 110 in FIG. 1 to ground node 120. TWV 220 introduces a certain amount of parasitic resistance 116 and parasitic inductance 114. Semiconductor die 200 is shown as including backside metal layer 258, lightly doped substrate 212, dielectric layer 216, metal segment 262 situated over TWV 220. Lightly doped substrate 212 is not highly conductive and has substrate thickness 222, which may be approximately 100 micrometers (μm), as an example only. TWV 220 includes sidewall dielectric layers 256 surrounding conductive plug 252, which can be made of a highly conductive material such as copper or gold. As shown in FIG. 2, TWV 220 has TWV depth 232, which is even greater than substrate depth 222 of lightly doped substrate 212 of die 200, and has TWV width 234. By way of examples, TWV depth 232 and TWV width 234 may be 100 μm and 50 μm, respectively.

TWV 220 creates a low resistance ground path and has an inductance that is much less than the inductance of a bond wire. However, the large size of TWV 220 may undermine purposeful application in power transistors and devices. For example, if TWV depth 232 is 100 μm, TWV depth 232 may be relatively large in comparison to other device sizes within a power transistor or device. This large size and this small resistance make it difficult to accommodate purposeful and sometimes desirable fine-tuning in resistance in power transistors or devices. These physical parameters also make it difficult to use TWV 220 to distribute resistance in power transistors and devices to function as ballast resistors, for example.

Figure 3:
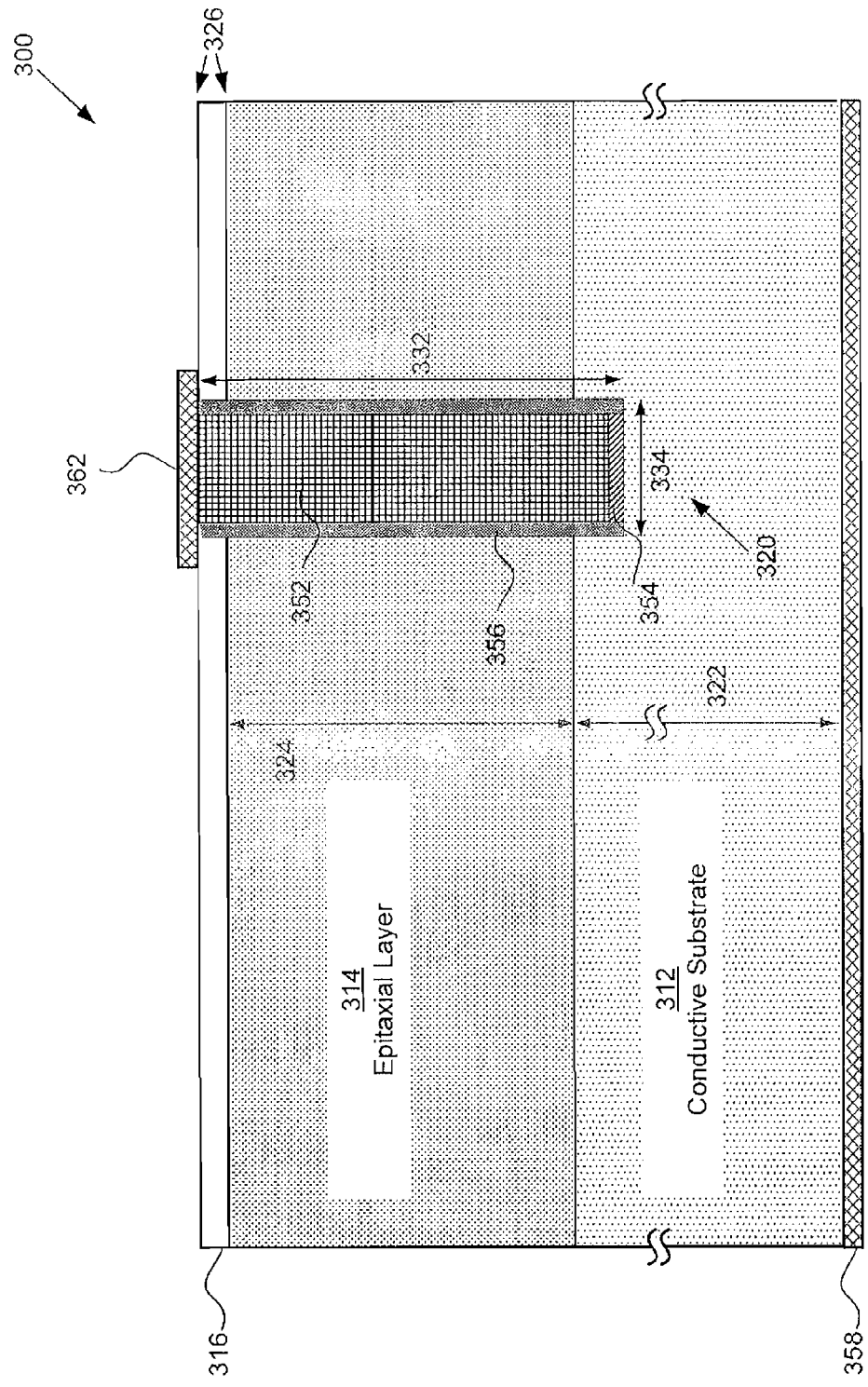
FIG. 3 illustrates a cross-sectional view of an exemplary deep silicon via structure in an exemplary semiconductor die in accordance with one embodiment of the present invention.

In view of the limitations of traditional bond wires and the limitations of the TWV structure shown in FIG. 2, FIG. 3 presents deep silicon via (DSV) 320 in exemplary semiconductor die 300. DSV 320 provides a structure to supply a very low inductance ground connection without the drawbacks and deficiencies of other structures. The small size, the short length, and the material of DSV 320 together introduce a somewhat larger resistance when compared to a TWV while resulting in a very low inductance ground path when compared with traditional structures such as bond wires and TWVs.

Semiconductor die 300 is shown as including backside metal layer 358, conductive substrate 312, epitaxial layer 314, pre-metal dielectric layer 316 and metal segment 362, with metal segment 362 situated over DSV 320. conductive substrate 312 may be a heavily doped p++ type or n++ type silicon substrate. Conductive substrate 312 may be connected to a ground plane and may have substrate thickness 322 approximately, for example, 100 μm or so. Epitaxial layer 314 may be supported by conductive substrate 312 and may have epitaxial layer thickness 324, which is often substantially less than substrate thickness 322. Epitaxial layer 314 may further comprise an epitaxial silicon layer of opposite conductivity type, with a thickness of for example 1 μm or so, to integrate a BJT transistor. Epitaxial layer thickness 324 may range, as one example, between approximately 7 μm and 20 μm.

DSV 320 creates a low inductance path between metal segment 362 and conductive substrate 312. As shown, DSV 320 has DSV depth 332 and DSV width 334, and DSV depth 332 may be substantially greater than DSV width 334. For example, DSV width 334 may be approximately 1.2 μm and DSV depth 332 may be approximately 10 μm, by way of examples only. The opening of DSV 320 may extend through pre-metal dielectric layer 316 and epitaxial layer 314, and partially into conductive substrate 312. Thus, if pre-metal dielectric thickness 326 is for example 0.8 μm, epitaxial thickness 324 is for example 8 µm, and DSV depth 332 is for example 10 µm, DSV 320 may extend only approximately 1.0 µm into conductive substrate 312. The large depth to cross-sectional diameter ratio of DSV 320, illustrated in FIG. 3 as a ratio of just under ten to one, creates a relatively small structure with a somewhat larger resistance in comparison to other structures such as TWV 220 in FIG. 2.

DSV 320 in FIG. 3 may include conductive plug 352 formed from tungsten, copper, polysilicon or other conductive material. Conductive plug 352 may be configured to have good electrical contact with both metal segment 362 and conductive substrate 312, and thereby function to conduct current from metal layer 362 to conductive substrate 312.

DSV 320 may further include sidewall dielectric layer 336 comprising an electrically insulating material such as silicon dioxide or silicon nitride to electrically isolate conductive plug 352 and epitaxial layer 314 and improve device performance. The bottom of DSV 320 may also include conductive liner 354 to enhance electrical contact between conductive plug 352 and conductive substrate 312. Conductive liner 354 may comprise titanium silicide, cobalt silicide or other liner material. Conductive liner 354 may have a thickness of for example 200 Angstroms (Å). It is noted that dielectric layer 356 is merely an optional isolation layer and can comprise, for example, a thin silicon dioxide or a thin silicon nitride film. Dielectric layer 356 is optional in that it is typically utilized where it is required to improve lateral isolation. However, dielectric layer 356 is not needed for DSV 320 to function; thus some embodiments may not use dielectric layer 356.

The embodiment of exemplary DSV 320 illustrated in FIG. 3 will be further described with reference to flowchart 400 in FIG. 4, which describes the steps of a method according to one embodiment of the present invention. It is noted that certain details and features have been left out of flowchart 400 that are apparent to a person of ordinary skill in the art. For example, a step may comprise one or more substeps as known in the art. While steps 410 through 460 indicated in flowchart 400 are sufficient to describe one embodiment of the invention, other embodiments of the invention may utilize steps different from those shown in flowchart 400.

Turning to step 410 of flowchart 400, step 410 comprises obtaining a processed wafer that includes a conductive substrate, an epitaxial layer and a pre-metal dielectric layer. Taking reference to FIG. 3, a processed wafer may include conductive substrate 312, epitaxial layer 314 and pre-metal dielectric layer 316. Conductive substrate 312 may be a silicon wafer of substrate thickness 322 and may have been heavily doped with a Group III material such as boron so that conductive substrate 312 is of a p++ type material, for example. Conductive substrate 312 could also be realized using n++ type material. Epitaxial layer 314 may have been deposited over conductive substrate 312 by means of an epi-reactor and be doped to be n-type over an n++ substrate or p-type over a p++ substrate 312. Pre-metal dielectric layer 316 may have been formed over epitaxial layer 314 and may be capable of supporting the later deposit of metal segment 362.

Figure 4:
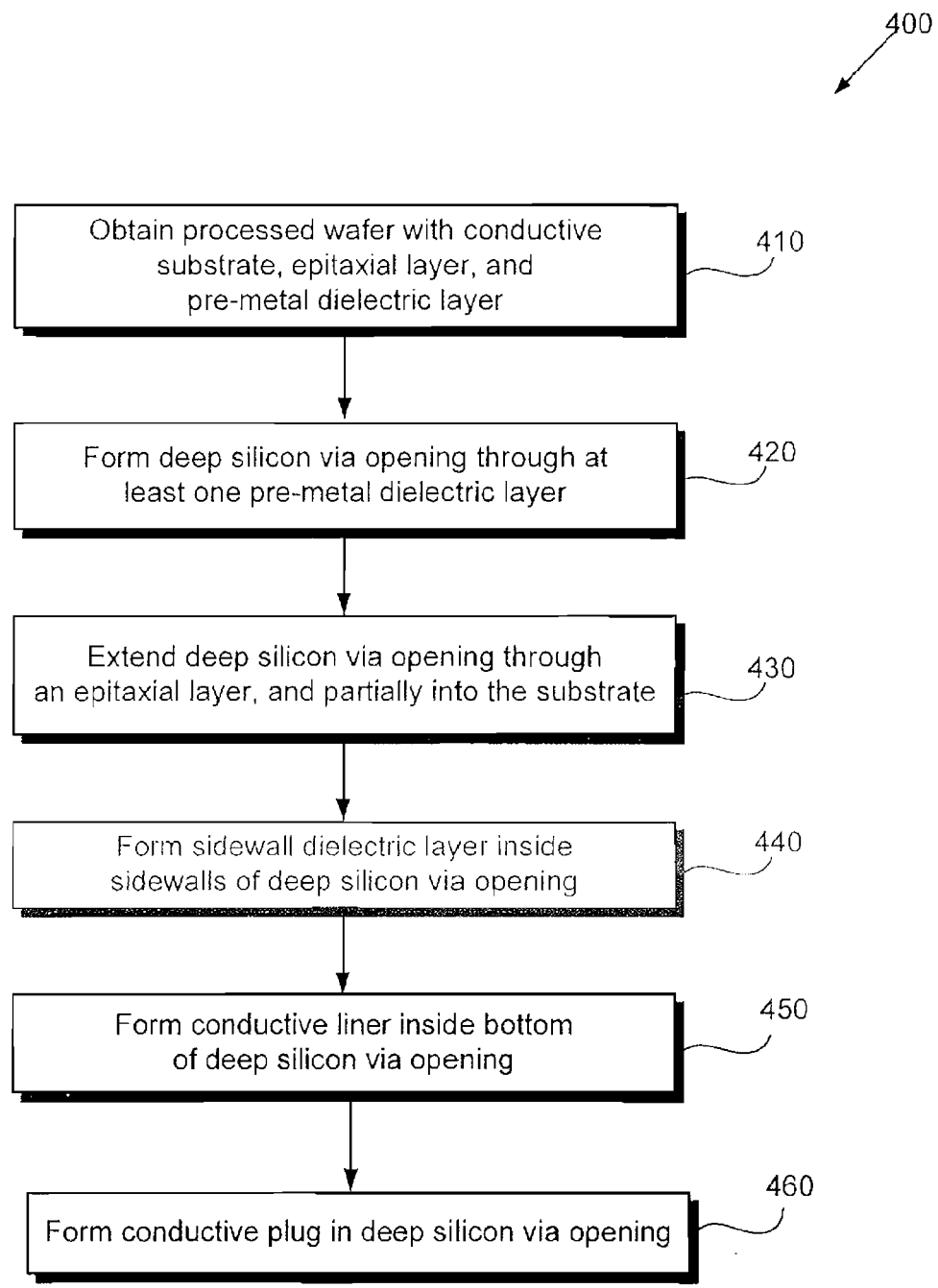
FIG. 4 is a flowchart illustrating the steps taken to implement an embodiment of the present invention.

Turning to step 420 of flowchart 400 in FIG. 4, step 420 comprises forming a deep silicon via opening through at least one pre-metal dielectric layer which could optionally be covered by an etch hardmask. Returning to FIG. 3, a deep silicon via opening corresponding to DSV 320 with DSV width 334 may be formed over pre-metal dielectric layer 316. A photo-resist mask may be selectively placed over pre-metal dielectric layer 316 to allow subsequent etch processes to form a region of DSV width 334. A dry etch involving an etchant such as fluoro-carbon based chemistry may be used to etch a region of DSV width 334 through pre-metal dielectric layer 316. The dry etch may be controlled using an etch stop-controlled etching process or other etching control method. After patterning the pre-metal dielectric layer 316 with DSV pattern 334, the photo resist mask may be removed.

Turning to step 430 of flowchart 400 in FIG. 4, step 430 comprises extending the deep silicon via opening through the epitaxial layer, and partially into the conductive substrate. As shown in FIG. 3, the deep silicon via opening corresponding to DSV 320 may be extended through epitaxial layer 314 and partially into conductive substrate 312. An etchant containing fluorine, chlorine, bromine and or iodine, for example, sulfur hexa fluoride ($SF_6$), may be used to etch through epitaxial layer 314 and partially into conductive substrate 312. The etch may be time-controlled to ensure that the deep silicon via opening is extended only partially into conductive substrate 312. For example, the etch step may be controlled to etch a distance of DSV depth 332 such as about 1.0 µm into conductive substrate 312.

Turning to step 440 of flowchart 400 in FIG. 4, step 440 comprises forming a sidewall dielectric layer inside the sidewalls of the deep silicon via opening. Returning to FIG. 3, sidewall dielectric layer 356 may be formed inside the sidewalls of DSV 320. Sidewall dielectric layer 356 requires a dielectric removal process to clear the bottom of DSV 320. It is noted that dielectric layer 356 is merely an optional isolation layer and can comprise, for example, a thin silicon dioxide or a thin silicon nitride film. Dielectric layer 356 is optional in that it is typically utilized where it is required to improve lateral isolation. However, dielectric layer 356 is not needed for DSV 320 to function; thus some embodiments may not use dielectric layer 356.

Turning to step 450 of flowchart 400 in FIG. 4, step 450 comprises forming a conductive liner inside the bottom of the deep silicon via opening. As shown in FIG. 3, conductive liner 354 may be deposited into the opening corresponding to DSV 320. As stated above in relation to FIG. 3, conductive liner 354 may comprise titanium silicide, cobalt silicide or other liner material and may have a thickness of 200 Å.

Turning to step 460 of flowchart 400 in FIG. 4, step 460 comprises forming a conductive plug in the deep silicon via opening. Returning to FIG. 3, a conductive material such as tungsten, copper or polysilicon may be deposited into deep silicon via opening 320 to form conductive plug 352.

Subsequent to step 460 of flowchart 400 in FIG. 4, metal segment 362 in FIG. 3 may be formed by depositing a metal or other conductive material over the opening to DSV 320. Metal segment 362 may be adapted to connect to a circuit component or a metal routing layer in the semiconductor die.

It is noted that conductive substrate 312 is typically adapted to connect to ground through backside metal layer 358, thus providing ground connection to DSV 320. DSV 320 in turn can be utilized to provide a solid ground connection to various circuits, such as the emitter of power transistor 110.

It is further noted that backside metal layer 358 is optional in case that ground is provided through the top metal layer of the circuit rather than through the backside of the die. Backside metal layer 358 can also be omitted if a die carrier or a chip leadframe for the silicon die can form an ohmic contact to conductive substrate 312 without requiring backside metal layer 358, by means of optimizing the die-attach or die solder chemistry allowing for good ohmic contact to conductive substrate 312.

In accordance with embodiments of the present invention, a deep silicon via such as DSV 320 allows the creation of a small structure that provides a ground path with a low inductance, and a finely tunable resistance. For example, a deep silicon via with a via width of approximately 1.2 μm, a via depth 332 of approximately 10 μm and a conductive plug substantially made of tungsten creates a ground path with a very low inductance of approximately 5 pico Henries ("pH") and a resistance of approximately 50 Ohms. Generally each ground node in the circuit is realized using an array of DSV to lower the resistance, achieving an effective inductance and resistance to ground of approximately 2 pH and 1 to 2 Ohms. A deep silicon via such as DSV 320 can be fabricated in a semiconductor die without the drawbacks or deficiencies of either bond wires or through-wafer vias, which are used to provide, for example, ground connection to critical power nodes, such as an emitter of a BJT. Typically, a plurality of deep silicon vias, such as DSV 320, can be fabricated into a semiconductor die to prevent thermal runaway of power transistors on the die, while providing a ground connection without consuming large amounts of semiconductor area. Owing to the small size and scalability of arrays of deep silicon via, DSV 320 can be used to ground other circuit components in addition to transistors such as capacitors, inductors, resistors, interconnect segments and other devices. DSV 320 can also be used to provide a ground node connection for shielding structures that are used as ground planes for example for inductors, microstrip or coplanar transmission lines. Moreover, DSV 320 can be used for various types of transistors fabricated in various semiconductor technologies, such as for silicon, silicon germanium (SiGe), gallium arsenide (GaAs), aluminum gallium arsenide (AlGaS), gallium nitride (GaN), and silicon carbide (SiC) based transistors.

Figure 5:
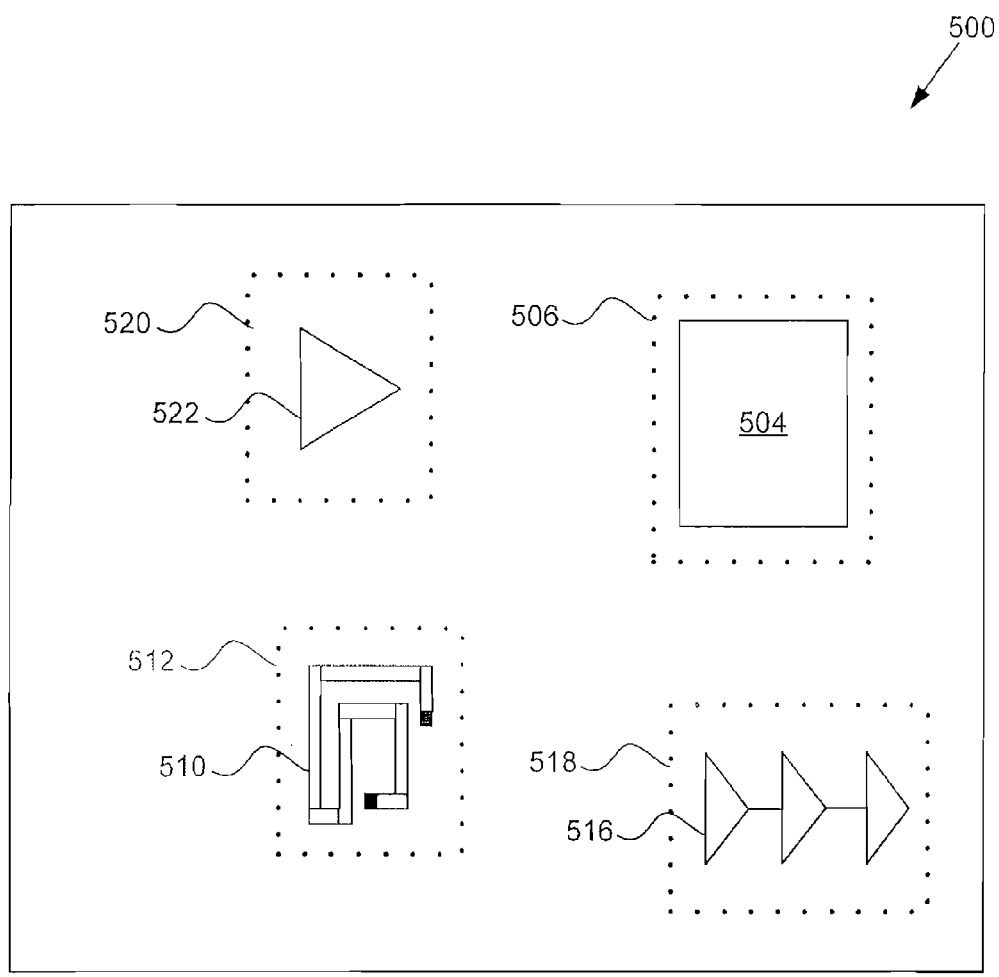
FIG. 5 illustrate a semiconductor die using deep silicon vias fabricated according to the present invention to provide Faraday cages for various exemplary circuits built in the semiconductor die.

The resistance of the deep silicon via at the emitter of the BJT reduces the gain of the transistor leading to a device that can be easier matched for optimum power amplification and efficiency. This small resistance also improves the linearity of the gain of the device over input power, leading to higher efficiency and more power output per transistor. In addition the resistance of the deep silicon via protects the output of the transistor from reflected power providing an inherent reliability and robustness feature. According to one embodiment of the invention, a plurality of deep silicon vias may also be used to form a "Faraday cage" around a circuit component to isolate the circuit component from electromagnetic interference and from substrate currents that may induce latch-up. FIG. 5 illustrates semiconductor die 500 which includes several configurations using deep silicon vias as Faraday cages. As shown, semiconductor die 500 comprises first shield 520 comprising a plurality of deep silicon vias surrounding amplifier 522. Similarly, semiconductor die 500 may comprise second shield 512 comprising a second plurality of deep silicon vias surrounding inductor 510, third shield 518 comprising a third plurality of deep silicon vias surrounding three-stage amplifier 516, and fourth shield 506 comprising a fourth plurality of deep silicon vias surrounding circuit component 504. Each deep silicon via in shields 520, 512, 518 and 506 can typically be connected to ground through a conductive semiconductor substrate (not pictured in FIG. 5) in semiconductor die 500 in a manner explained above. As shown, shields 520, 512, 518 and 506 can therefore be used to form a Faraday cage around various circuit components to provide isolation from electromagnetic interference and from substrate currents that may be injected from other devices in the integrated circuit.

Thus, the present application discloses a novel and inventive solution for a deep silicon via structure and method for fabricating same. By fabricating and using deep silicon via structures to, for example, provide ground connections to power transistors, a low-inductance path with a finely tunable resistance can be readily achieved. In addition, deep silicon via structures present a novel way to build "Faraday cages" to isolate circuit components, such as analog circuit blocks, from electromagnetic interference and substrate currents. By replacing many of the highly inductive and relatively long bond wires in traditional designs, the present invention allows semiconductor circuit designers to realize better performing and advantageous circuits. Moreover, the disclosed solution is advantageously compatible with existing semiconductor manufacturing technology.

From the above description of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A method of fabricating a deep silicon via in a semiconductor die, said method comprising:
   forming a deep silicon via opening through at least one pre-metal dielectric layer of said semiconductor die;
   extending said deep silicon via opening through at least one epitaxial layer of said semiconductor die, and partially into a conductive substrate of said semiconductor die;
   forming a conductive plug in said deep silicon via opening;
   wherein said at least one epitaxial layer and said conductive substrate have a same conductivity type.

2. The method of claim 1, wherein said forming said deep silicon via opening comprises using a dry etch process.

3. The method of claim 1, wherein said forming said deep silicon via opening comprises using an etch stop-controlled etching process.

4. The method of claim 1, wherein said forming said deep silicon via opening comprises using an etchant having a fluoro-carbon based chemistry.

5. The method of claim 1, wherein said extending said deep silicon via opening comprises using a time-controlled etching process.

6. The method of claim 1, wherein said extending said deep silicon via opening comprises using an etchant containing fluorine, chlorine, bromine, and/or iodine.

7. The method of claim 1, further comprising forming a sidewall dielectric layer in said deep silicon via opening prior to forming said conductive plug.

8. The method of claim 1, further comprising forming a conductive liner in said deep silicon via opening prior to forming said conductive plug.

9. A method of fabricating a deep silicon via in a semiconductor die, said method comprising:
   forming a deep silicon via opening through at least one epitaxial layer of said semiconductor die;
   extending said deep silicon via partially into a substrate of said semiconductor die;
   forming a conductive plug in said deep silicon via opening;
   wherein said at least one epitaxial layer and said substrate have a same conductivity type.

10. The method of claim 9, wherein said forming said deep silicon via opening comprises using a dry etch process.

11. The method of claim 9, wherein said forming said deep silicon via opening comprises using an etch stop-controlled etching process.

12. The method of claim 9, wherein said forming said deep silicon via opening comprises using an etchant having a fluoro-carbon based chemistry.

13. The method of claim 9, wherein said extending said deep silicon via opening comprises using a time-controlled etching process.

14. The method of claim 9, wherein said extending said deep silicon via opening comprises using an etchant containing fluorine, chlorine, bromine, and/or iodine.

15. The method of claim 9, further comprising forming a sidewall dielectric layer in said deep silicon via opening prior to forming said conductive plug.

16. The method of claim 9, further comprising forming a conductive liner in said deep silicon via opening prior to forming said conductive plug.

\* \* \* \* \*